(12) United States Patent
Vargas

(10) Patent No.: US 6,383,690 B1
(45) Date of Patent: May 7, 2002

(54) PLATEMAKING SYSTEM AND METHOD USING AN IMAGING MASK MADE FROM PHOTOCHROMIC FILM

(75) Inventor: George A. Vargas, Moorpark, CA (US)

(73) Assignee: Autologic Information International, Inc., Thousand Oaks, CA (US)

( * ) Notice: Subject to any disclaimer, the term of this patent is extended or adjusted under 35 U.S.C. 154(b) by 0 days.

(21) Appl. No.: 09/522,746

(22) Filed: Mar. 10, 2000

Related U.S. Application Data

(63) Continuation-in-part of application No. 09/458,464, filed on Dec. 9, 1999.

(51) Int. Cl.[7] ............................ G03F 9/00; G03F 7/213
(52) U.S. Cl. ....................... 430/5; 430/19; 430/300; 430/302; 430/945; 430/962; 250/208.1
(58) Field of Search .......................... 430/5, 19, 945, 430/962, 302, 300; 250/208.1

(56) References Cited

U.S. PATENT DOCUMENTS

| | | | | |
|---|---|---|---|---|
| 4,535,348 A | * | 8/1985 | Iwakura et al. | 346/221 |
| 4,684,600 A | * | 8/1987 | Worns et al. | 430/271.1 |
| 4,729,310 A | * | 3/1988 | Love, III | 101/157 |
| 4,772,922 A | * | 9/1988 | Kawahara et al. | 355/32 |
| 5,248,899 A | * | 9/1993 | Haronian et al. | 307/201 |
| 5,606,170 A | * | 2/1997 | Saaski et al. | 250/458.1 |
| 5,666,188 A | * | 9/1997 | Chmielnik | 355/40 |
| 5,804,340 A | * | 9/1998 | Garza et al. | 430/5 |
| 5,854,710 A | * | 12/1998 | Rao et al. | 359/559 |
| 6,020,108 A | * | 2/2000 | Goffing et al. | 430/306 |
| 6,050,193 A | * | 4/2000 | DeBoer et al. | 101/466 |
| 6,105,502 A | * | 8/2000 | Wagner et al. | 101/491 |
| 6,110,165 A | * | 8/2000 | Ota | 606/4 |

* cited by examiner

Primary Examiner—Janet Baxter
Assistant Examiner—Sin J. Lee
(74) Attorney, Agent, or Firm—Koppel, Jacobs, Patrick & Heybl

(57) ABSTRACT

A platemaking system uses an intermediate imaging mask made of a film of photochromic material, preferably bacteriorhodopsin. The film is normally transparent, but it is temporary made opaque by exposure to light of a certain wavelength. An image is formed on the mask using light of the appropriate wavelength, which renders portions of the mask opaque. The mask is then interposed between a photosensitive printing plate and a light source which produces light to which the plate is sensitive, exposing the printing plate and thereby transferring the desired image onto the plate. The described method is preferably implemented using a transparent rotating drum that is coated with a bR film. As the drum rotates past a green or yellow laser, a desired image is written onto the film by the laser's beam. The drum rotates the image until it is opposite a photosensitive printing plate, and a light source inside the drum exposes the plate through the mask to transfer the image. The system preferably includes another light source that is directed onto the formed image after it has been transferred which "erases" the film and thus prepares it to accept a new image.

26 Claims, 5 Drawing Sheets

PLATEMAKING SYSTEM AND METHOD USING AN IMAGING MASK MADE FROM PHOTOCHROMIC FILM

CROSS-REFERENCE TO RELATED APPLICATIONS

This application is a continuation-in-part of application Ser. No. 09/458,464, filed Dec. 9, 1999.

BACKGROUND OF THE INVENTION

1. Field of the Invention

This invention is concerned with systems and methods of forming images on photosensitive printing plates used in printing press systems.

2. Description of the Related Art

Modem printing presses, such as those used to print newspapers and magazines, typically employ photosensitive printing plates. A desired image is formed on the printing plate, which is then installed in a press and repeatedly used to produce copies of the formed image.

Several methods are used to form images on the photosensitive plates. For example, a negative film containing a desired image can be placed over the printing plate. Light to which the plate is sensitive (typically ultraviolet (UV);) is directed through the film onto the plate, exposing the plate and thereby transferring the desired image. However, preparation of a negative film for each image can be a time-consuming and costly process.

The use of a negative film can be avoided by using a "computer-to-plate" (CTP) process, in which a laser is used to expose the plate directly. Here, a laser beam exposes one pixel at a time as it is deflected across the plate. The exposure time of the plate, along with the time allotted to expose each pixel, define the power requirement of the laser, which must have sufficient power to expose the plate in the allotted time.

Photosensitive printing plates are typically sensitive to UV light, and a CTP process using such a plate would require a UV laser. However, UV lasers capable of providing the required power tend to be large, and have special reliability and cooling requirements, making them prohibitively expensive. Printing plates are available that are sensitive to more affordable red or green lasers and which require much less power to expose, but these plates also tend to be very expensive.

A need exists for a method of exposing affordable UV-sensitive printing plates via a CTP process that does not require the use of expensive UV lasers.

SUMMARY OF THE INVENTION

A platemaking system and method are presented which overcome the problems noted above, enabling low-cost printing plates to be exposed with inexpensive light sources in a CTP process.

The novel process makes use of an intermediate imaging mask made of a film of photochromic material, preferably bacteriorhodopsin. The photochromic film is nominally substantially transparent, but is temporarily made substantially opaque by exposure to light of a first wavelength. A desired image is formed on the mask, preferably by deflecting a laser beam operating at the first wavelength across the mask, which renders portions of the mask opaque. The mask is then interposed between a photosensitive printing plate and a light source which produces light to which the plate is sensitive, exposing the printing plate and thereby transferring the desired image onto the plate.

The photochromic film is preferably made from bacteriorhodopsin (bR). Bacteriorhodopsin is initially transparent to UV/violet light, but becomes opaque to UV/violet light when exposed to green light (suitably provided with an inexpensive green or yellow laser). Those portions of the bR-based film which have been transformed remain opaque to UV/violet light for up to a minute or more, enabling the film to serve as an intermediate imaging mask and eliminating the need to employ special high power equipment that might otherwise be required in a CTP system. Once the image is formed on the bR-based mask, a UV/violet (non-laser) light source can expose conventional low-cost UV-sensitive printing plates through the mask to transfer the desired image onto the plate.

The described method is preferably implemented using a transparent rotating drum that is coated with a bR film. As the drum rotates past a green or yellow laser, a desired image is written onto the film by the laser's beam. A printing plate is placed adjacent to the surface of the drum; the drum rotates the image until it is opposite the plate, and a light inside the drum exposes the plate through the mask to transfer the image.

In the absence of green light, bR eventually reverts to its transparent (to UV/violet light) state naturally, though the reversion can be delayed by exposing the mask to both green/yellow and UV/violet light simultaneously. By exposing the bR film to UV/violet light, this transformation is made practically instantaneous. Therefore, a platemaking system per the present invention which uses a bR-based mask preferably includes a UV/violet light source, which is directed onto the bR film after the image has been transferred to "erase" the film and prepare it for a new image.

Further features and advantages of the invention will be apparent to those skilled in the art from the following detailed description, taken together with the accompanying drawings.

DETAILED DESCRIPTION OF THE INVENTION

Figure 1A:
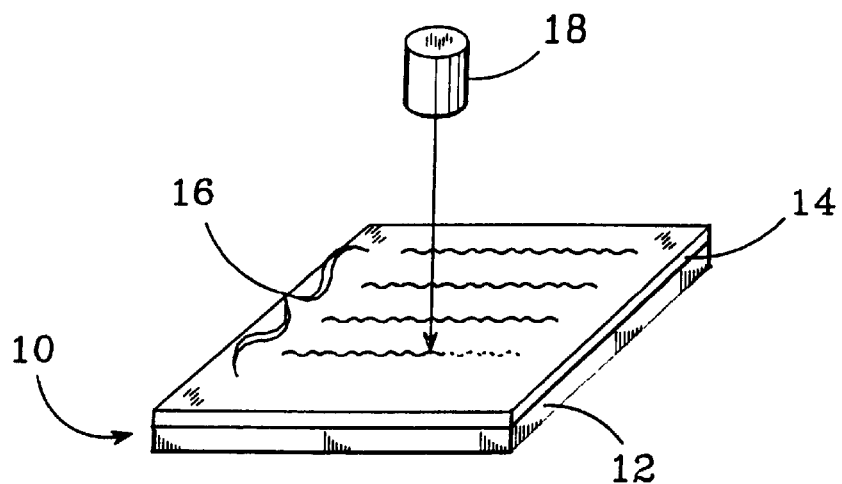
FIGS. 1a and 1b are diagrams illustrating the basic principles of the invention.
Figure 1B:
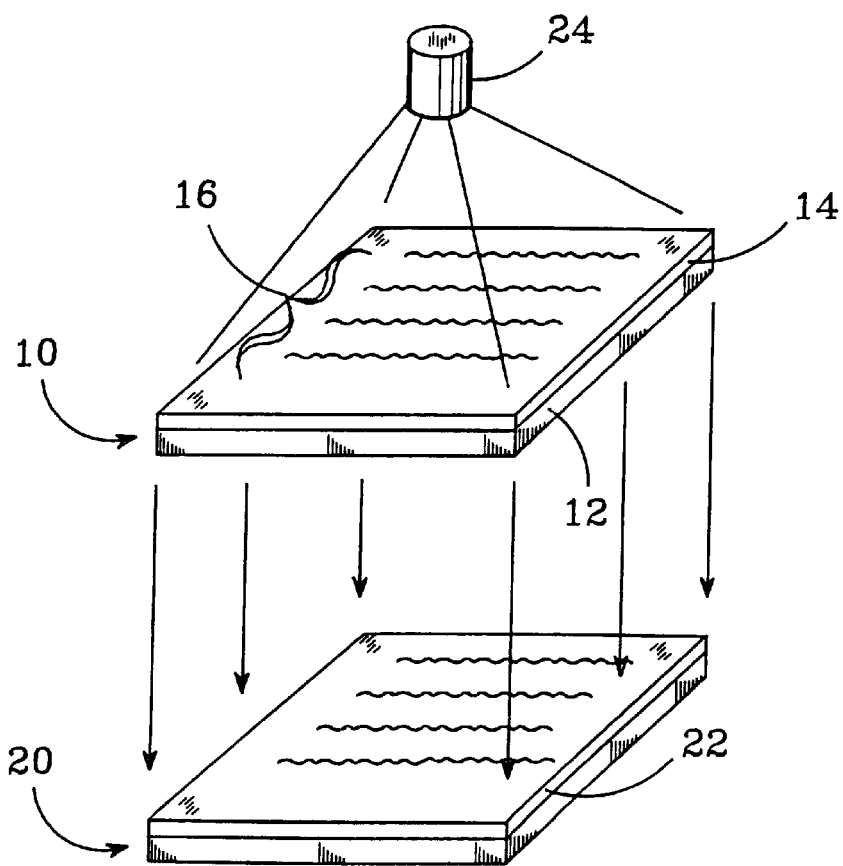

The present invention provides a method and system of forming an image on a photosensitive printing plate of the type used in a printing press. FIGS. 1a and 1b illustrate the two essential steps of the platemaking method described herein. In FIG. 1a, a mask 10 is provided, which is typically made from a transparent substrate 12, such as glass or quartz, and a photochromic film 14. A photochromic film is a film that changes its optical properties when exposed to light. In this application, the film 14 must have at least two optical states: a substantially transparent state and a substantially opaque state. Furthermore, it must be possible to transform the film between these two states by exposing the film to light, and the film must possess the ability to remain in a transformed state for at least several seconds.

The ability to transform film 14 from one state to the other is exploited to form a desired image 16 on mask 10. An image can be formed on mask 10 in a number of ways: for example, a negative film containing the desired image could be placed between a light source and the mask. Light passing through the negative film strikes portions of the mask, causing those portions to be transformed from their opaque state to their transparent state (or vice versa, depending on the specific characteristics of the photochromic film and the light source used), thereby forming the desired image in the mask.

The image 16 can also be formed on mask 10 by means of a laser 18 which is deflected across the mask; the portions of the mask struck by the beam are transformed to form the desired image. This approach eliminates the need for a negative film and is preferred, provided that the photochromic film can be transformed with a relatively simple and inexpensive laser.

With image 16 formed on mask 10, it can now be transferred to a photosensitive printing plate 20, as illustrated in FIG. 1b. A photosensitive printing plate is a plate coated with a photosensitive material 22, upon which a permanent image can be formed when exposed to light of a particular wavelength. The mask 10 containing image 16 is placed between a light source 24 and the photosensitive printing plate 20. Light source 24 produces light at the wavelength necessary to expose the photosensitive printing plate, which passes through the mask to transfer image 16 onto printing plate 10.

With mask 10 serving to receive and temporarily retain an image long enough to allow its transfer to a printing plate, is referred to herein as an "intermediate imaging mask". Using an intermediate imaging mask eliminates the need for a high power laser light source or for specially treated photosensitive printing plates, which might otherwise be needed in a CTP system. With the mask in place, a very brief exposure time is no longer required, and as such conventional low-cost UV-sensitive printing plates can be used.

Figure 2:
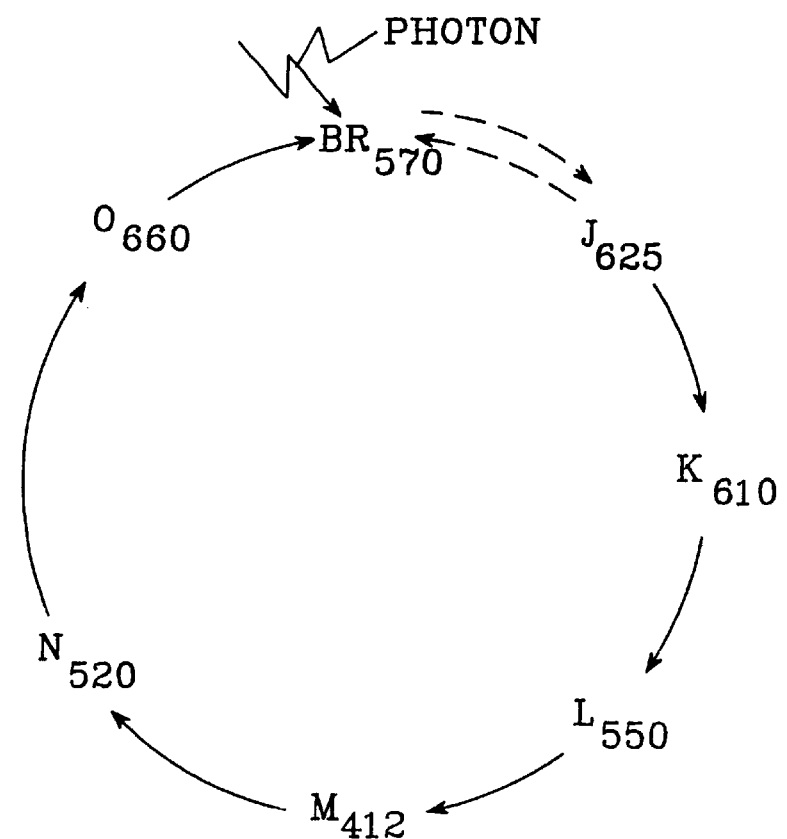
FIG. 2 is a diagram illustrating the photochemical cycle of the bacteriorhodopsin molecule.

The photochromic film 14 is preferably made from bacteriorhodopsin (bR), which is a biological photochrome isolated from *Halobacterium salinarium*. The bR molecule has excellent thermal and photochemical stability, and has found numerous applications based on its proton-motive, photoelectric and photochromic properties. Its photochromic properties are exploited in the present application; a diagram illustrating the photochemical cycle of the bacteriorhodopsin molecule is shown in FIG. 2. In the absence of light, the bR molecule occupies a stable state identified in FIG. 2 as $BR_{570}$; a film of bR is substantially transparent to UV/violet light (in the range of 375 nm to 425 nm) while in this state. However, exposing the bR film to green or yellow light (in the range of 525 nm to 600 nm) starts a photochromic transformation which, after about 50 µs, causes the molecule to shift to the state identified as "$M_{412}$"; a film of bR in this state is substantially opaque to UV/violet light (in the range of 375 nm to 425 nm). As used herein, a bR-based film in its "opaque" state is substantially opaque to UV/violet light, and in its "transparent" state is substantially transparent to UV/violet light. When a bR-based film is used, light source 18 is preferably a conventional green or yellow laser, which economically produces the 525 nm to 600 nm light required to transform the film from transparent to opaque. A bR-based film also possesses the ability to remain in its opaque state for a short time after an image has been formed on it: once in the $M_{412}$ state, bR will revert to its transparent state on its own, but not until a time delay that can be easily varied from about 0.01 second to 100 seconds has transpired. This delay can be affected by, for example, the pH or temperature of the film, with time delays of up to 30 seconds easily obtained.

A time delay can also be achieved by simultaneously exposing the bR-based film to green/yellow light in the range of 525 nm to 600 nm and to UV/violet light in the range of 325 nm to 425 nm, which inhibits changes of state in the bR. This technique can be beneficial when using a bR-based mask to expose printing plates sensitive to violet or UV light, which are not sensitive to the green light: the combination of green and violet light inhibits the erasure of the image on the bR-based mask, while the violet light exposes the photosensitive printing plate. Note that a single source which produces light of both wavelengths might be used to inhibit changes of state in the bR.

Figure 3:
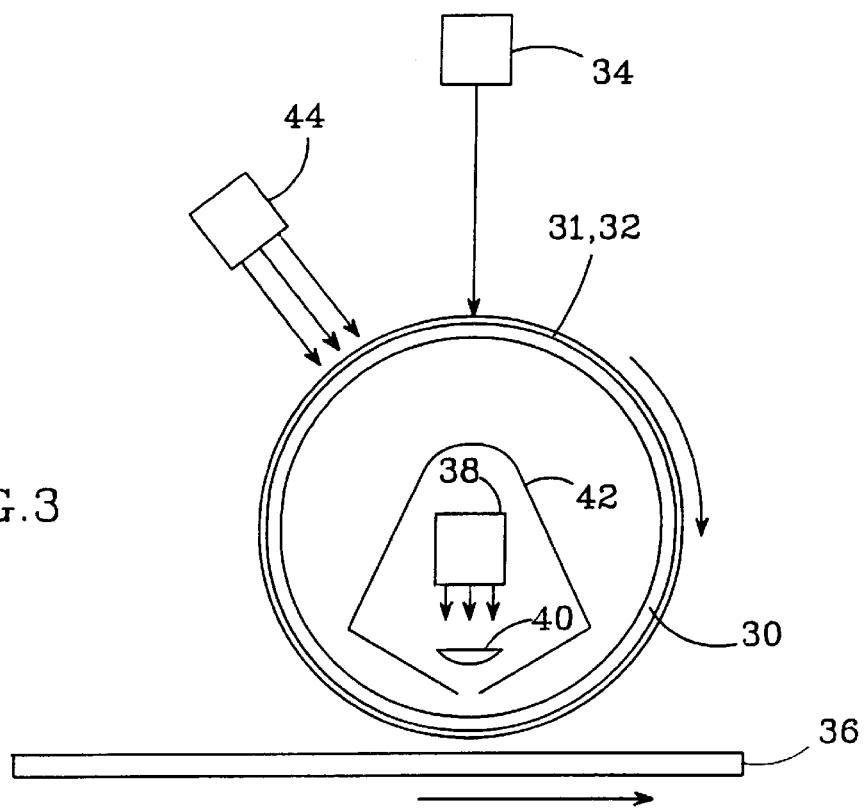
FIG. 3 is a diagram depicting an exemplary implementation of a platemaking system per the present invention.

An exemplary implementation of a platemaking system per the present invention is shown in FIG. 3. A transparent rotating drum 30, preferably made from glass or quartz, is coated with a photochromic film 31 having the properties noted above, forming a mask 32. Though film 31 is shown on the exterior surface of drum 30, it could alternatively reside on the interior surface of the drum. A first light source 34 is arranged to direct light onto the mask for the purposes of forming a desired image on it. Photochromic film 31 is preferably made from bR and light source 34 is preferably a green or yellow laser, though other film and light source combinations could be used to form an image on mask 32. For example, light source 34 might comprise a non-laser lamp and a filter that allows only light of the wavelength needed to transform the photochromic film to pass, with the filtered light directed through a negative film onto the photochromic film to form an image.

When light source 34 is a laser, the laser's beam is deflected across mask 32, typically one line at a time, causing those portions of the mask that are struck by the laser light to be transformed from transparent to opaque and thereby forming a desired image on the mask. The speed at which drum 30 rotates, the power of laser 34, and the speed with which the laser beam can be deflected must all be considered when designing a system, with the drum speed kept low enough to enable the laser to adequately expose those portions of the mask that must be transformed to form the image.

With the image formed on mask 32, the mask is now used as an intermediate imaging mask. This is done by rotating the formed image between a movable photosensitive printing plate 36 and a light source 38 which produces light to which the printing plate is sensitive. The movable photosensitive printing plate 36 is located adjacent to the exterior surface of the drum 30. Because the image is formed on a mask 32 coating the surface of drum 30, light source 38 is located on the interior of the drum, so that mask 32 is located between light source 38 and printing plate 36.

In operation, as the image-containing portion of mask 32 rotates into position between light source 38 and printing plate 36, the light produced by light source 38 shines through the formed image and onto the printing plate, thereby transferring the image onto the plate. The light produced by light source 38 may be better directed onto mask 32 with the use of, for example, one or more lenses 40, and a reflector 42 which increases the amount of light directed through mask 32.

Printing plate 36 is preferably sensitive to UV/violet light, due to the ready availability and low cost of UV-sensitive printing plates. When a UV-sensitive plate is used, light source 38 must produce UV/violet light. Light source 38 need not be a laser, though use of a laser is acceptable. Another suitable implementation for light source 38 is a light source and a bundle of optical fibers which carry the light toward the mask.

Printing plate 36 is preferably movable, and is arranged to move at the same speed that the drum rotates. Synchronizing the drum speed and the plate speed in this way ensures that the proportions found in the formed image are maintained when the image is transferred to the plate. With this approach, the formed image is essentially transferred onto the printing plate one thin slice at a time rather than all at once, as each slice rotates into position between light source 38 and printing plate 36.

Once the image has been transferred to printing plate 36, the image on mask 32 is no longer needed. Because the portion of the mask containing the formed image is no longer being exposed to the light (from source 34) necessary to transform the film from transparent to opaque, the mask will eventually revert to its transparent state on its own. However, this process can be sped up in some photochromic materials by exposing the material to light at a wavelength different from that used to form the image. Bacteriorhodopsin, for example, may be quickly returned (in about 200 ns) to transparent state by exposure to light at a wavelength of 412±50 nm. Platemaking systems employing a photochromic film with this property preferably include another light source 44, which produces light capable of causing the film to revert to its transparent state and thereby effectively erase the formed image. Note that the 412±50 nm light used to erase the image may be the same as that used to expose the photosensitive printing plate. When this is the case, it is advisable to simultaneously expose the film to both violet and green light as described above when exposing the plate, to inhibit state changes in the film until after the plate is exposed.

A system in accordance with FIG. 3 is typically operated by continuously rotating the drum 30, with new images continuously being formed, transferred to a photosensitive printing plate, and erased. When used in this fashion, printing plate 36 may comprise a single, continuous printing plate, or a number of individual plates arranged end to end.

The above discussion assumes the use of a photochromic film that is nominally transparent, with portions of the film made opaque by exposure to light. However, a film which is nominally opaque might also be employed, as long as portions of the film are transformed from opaque to transparent by exposure to light, so that an image or its negative can be formed on the film.

Figure 4A:
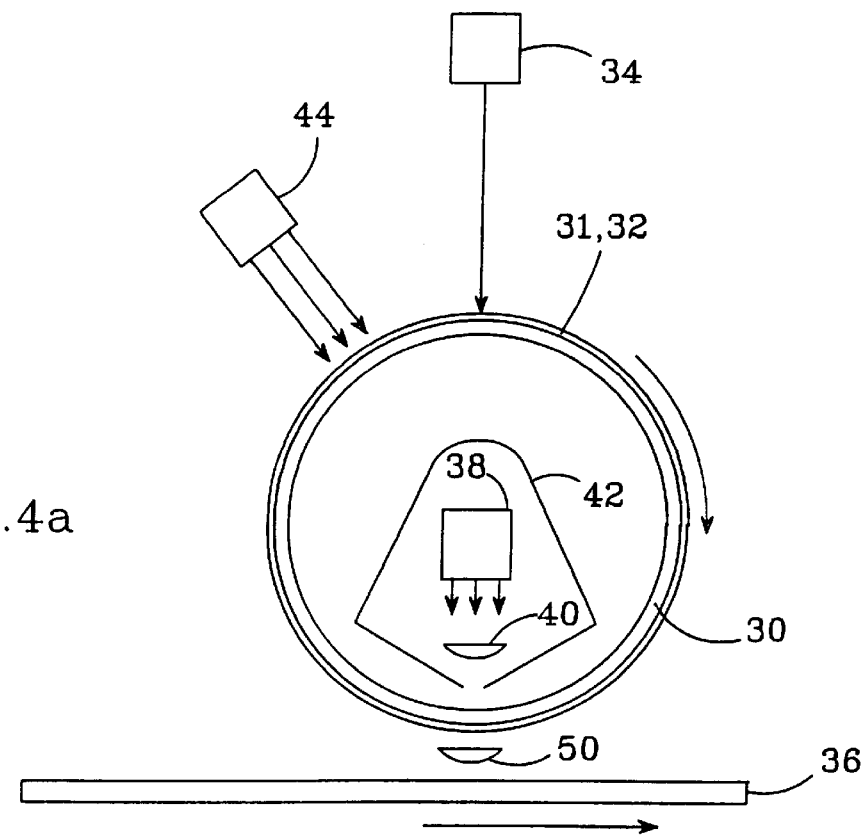
FIGS. 4a and 4b are diagrams depicting alternative embodiments of the platemaking system of FIG. 3.
Figure 4B:
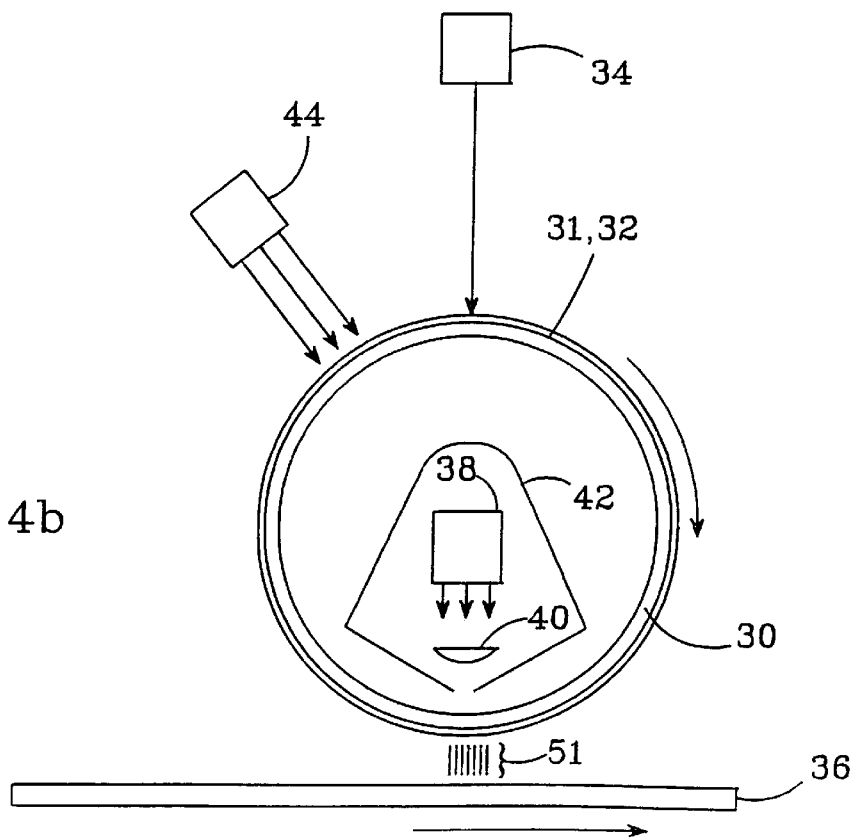

It may be difficult or impractical to locate printing plate 36 in close proximity to rotating drum 30, due to the presence of, for example, pinch rollers that move the printing plate. An alternative implementation of the system of FIG. 3 which solves this problem is shown in FIG. 4a. An additional lens 50, such as a graduated index (GRIN) lens, is placed between mask 32 and photosensitive printing plate 36, to enable the image to remain focused on the plate as the distance between plate and mask is increased. Another possibility, illustrated in FIG. 4b, is to use a fiber optic array 51 to transfer the image from the mask to the photosensitive printing plate.

Figure 5:
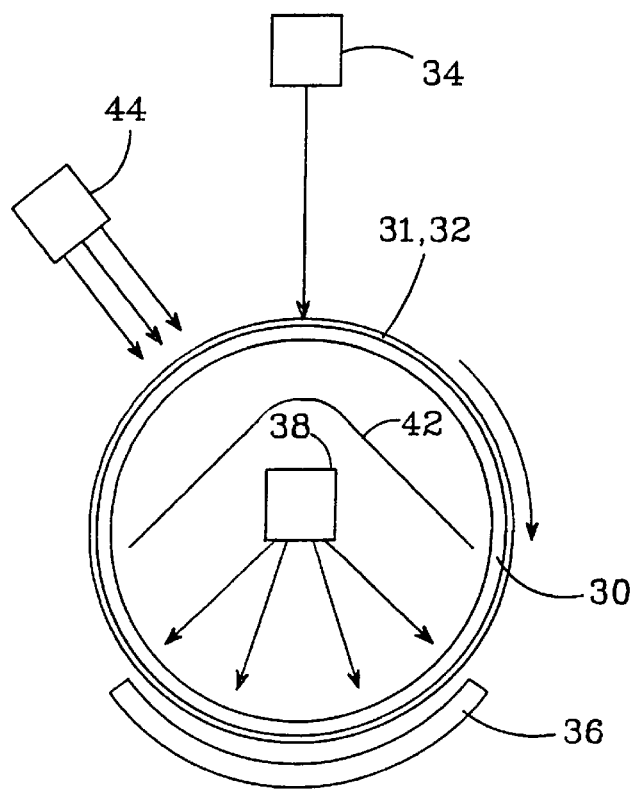
FIGS. 5 and 6 are diagrams depicting other possible embodiments of the platemaking system of FIG. 3.

Another possible variation on the platemaking system of FIG. 3 is shown in FIG. 5. Here, photosensitive printing plate 36 is at least partially curved around drum 30, to allow a much larger area of the printing plate to be exposed at once. This embodiment also requires that reflector 42 be modified to direct the output of light source 38 over a much wider arc.

Figure 6:
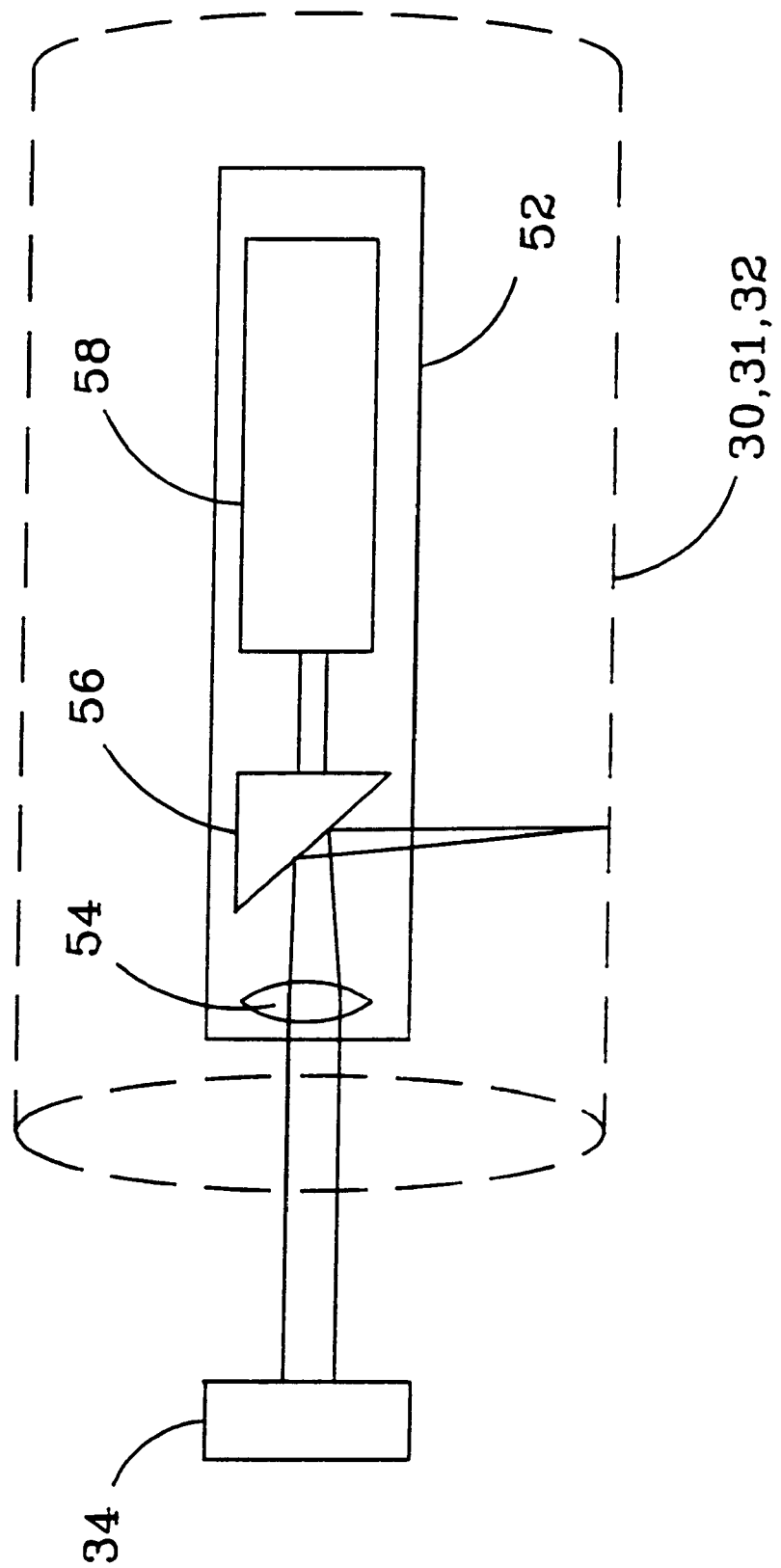

It is also possible to apply an image to the mask from within the transparent drum. One possible way of accomplishing this is shown in FIG. 6. Here, light source 34 is a laser, which directs its beam into a movable deflector module 52 on the interior of the coated drum 30. Deflector module 52 typically includes a focusing lens 53, which directs the beam onto a beam deflector 54 attached to a spinner motor 56. The spinner motor 56 rotates the beam deflector 54 to deflect the beam across mask 32 and thereby impart the desired image onto the mask. Once the desired image is imparted, movable deflector module 52 would typically be removed from the interior of drum 30 prior to exposing the printing plate.

Figure 7:
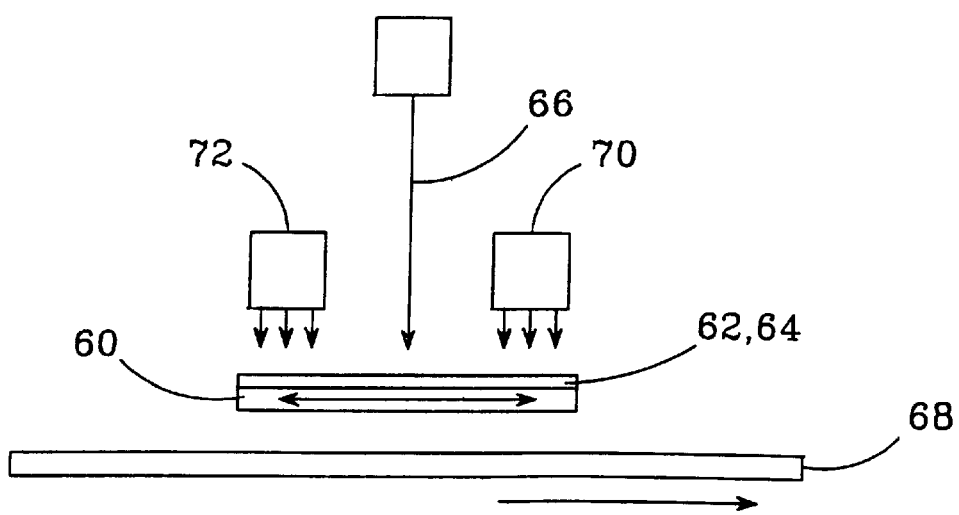
FIG. 7 is a diagram of another possible implementation of a platemaking system per the present invention.

Another possible implementation of a platemaking system per the present invention is shown in FIG. 7. A movable transparent plate 60 is coated with a film 62 made from a photochromic material having the properties discussed above, which will serve as an intermediate imaging mask 64. Transparent plate 60 is moved past a scanning laser beam 66 which places a desired image on mask 64 as described above. A photosensitive printing plate 68 is located below transparent plate 60. After the image is formed on mask 64, transparent plate 60 is moved so that it is between a light source 70 and printing plate 68. Light source 70 produces light to which printing plate 68 is sensitive, and thus causes the formed image to be transferred onto printing plate 68. If the photochromic film 62 can be transformed from a transparent to an opaque state by exposure to light at a particular wavelength (as with bR), the system preferably includes another light source 72 which produces such a light. Then, after the image has been transferred onto printing plate 68, transparent plate 60 is moved under light source 72, which serves to erase the formed image. The printing plate 68 is then advanced and the process repeated. Using this method, the movable transparent plate 60 may be much smaller than the printing plate and an image may be applied to the printing plate in a tiled or a swath fashion. However, because plate 60 must move back and forth and be repeatedly started and stopped, the rotating drum implementations of FIGS. 3 and 4 are preferred. As with the implementations illustrated in FIGS. 1, 3 and 4, photochromic film 62 is preferably made from bR, scanning laser beam 66 is preferably provided by a green or yellow laser, printing plate 68 is preferably sensitive to UV/violet light and is exposed with a UV/violet light source 70, and light source 72 is a violet light source (producing light at about 412 nm).

It should be noted that the platemaking system implementations described herein are only examples of how a system using a photochromic-film based imaging mask might be implemented. Which parts move and which are stationary is unimportant to the basic operation of the invention, and the order of operations may also be changed without affecting the result. For example, in FIG. 7, light source 70 might be movable relative to transparent plate 60, or may be fixed while printing plate 68 moves. Scanning laser beam 66 might be moved across transparent plate 60, or plate 60 might be moved under a scanning laser beam. If the photochromic material used is bR, it should be noted that mutant forms of bR might also be used, or that the bR's properties might be altered in the manufacturing process, such that light sources producing light at wavelengths other than those discussed herein might be required.

Bacteriorhodopsin is available in either liquid or solid form from, for example, Munich Innovative Biomaterials GmbH, Martinsried, Germany. It can be applied to a transparent substrate as described herein as a film or a coating.

The preferred embodiments of this invention have been illustrated and described above. Modifications and additional embodiments, however, will undoubtedly be apparent to those skilled in the art. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

I claim:

1. A platemaking system using a photochromic film-based imaging mask, comprising:
    a mask comprising a bacteriorhodopsin (bR) film which has a first state in which it is substantially transparent to light in the range of 325 nm to 425 nm, a second state in which it is substantially opaque to light in the range of 325 nm to 425 nm, and is inhibited from changing between said first and second states when simultaneously exposed to light in-the range of 525 nm to 600 nm and to light in the range of 325 nm to 425 nm, said bR film at least temporarily transforming from said substantially transparent state to said substantially opaque state when exposed to light at a first wavelength in the range of 525 nm to 600 nm,
    a first light source arranged to expose said mask to light at said first wavelength so as to render portions of said mask substantially opaque and thereby form a desired image on said mask,
    a photosensitive printing plate sensitive to light in the range of 325 nm to 425 nm,
    a second light source arranged to expose said printing plate through said mask with light in the range of 325 nm to 425 nm such that the image formed on said mask is transferred to said printing plate, and
    a third light source directed onto the portion of said mask being exposed to light from said second light source, said third light source arranged to expose said mask to light in the range of 525 nm to 600 nm while said printing plate is simultaneously exposed through said mask with said second light source to inhibit state changes in said film.

2. The platemaking system of claim 1, wherein said first light source is a green or yellow laser, the output of said green or yellow laser deflected across said bR film to form said desired image.

3. The platemaking system of claim 1, wherein said photosensitive printing plate is sensitive to ultraviolet/violet light and said second light source is an ultraviolet/violet light source.

4. The platemaking system of claim 1, wherein said photochromic film transforms from said substantially opaque state to said substantially transparent state when exposed to light at a second wavelength, said system further comprising a fourth light source arranged to expose said mask to light at said second wavelength after said image is transferred to said printing plate such that said formed image is erased.

5. The platemaking system of claim 4, wherein said photochromic film comprises bacteriorhodopsin (bR) and said second wavelength is about 412 nm±50 nm.

6. The platemaking system of claim 1, further comprising at least one lens located between said second light source and said photosensitive printing plate to focus said formed image onto said photosensitive printing plate.

7. The platemaking system of claim 1, wherein said mask comprises a transparent rotating drum coated with said photochromic film, said second light source located on the interior of said transparent drum, said first light source arranged to form said image on said mask while said drum is rotating and said second light source arranged to expose said printing plate through said mask when said drum has rotated such that said formed image is between said second light source and said printing plate, thereby transferring said image to said plate.

8. A platemaking system using a bacteriorhodopsin (bR) film-based imaging mask, comprising:
    a transparent rotating drum,
    a bR film applied to a surface of said transparent rotating drum to form a mask on said drum, said bR film having a first state in which it is substantially transparent to light in the range of 325 nm to 425 nm, a second state in which it is substantially opaque to light in the range of 325 nm to 425 nm, said bR film inhibited from changing between said first and second states when simultaneously exposed to light in the range of 525 nm to 600 nm and to light in the range of 325 nm to 425 nm, said film at least temporarily transforming from said substantially transparent state to said substantially opaque state when exposed to light at a first wavelength in the range of 525 nm to 600 nm,
    a first light source arranged to expose said mask to light at said first wavelength so as to render portions of said mask substantially opaque and thereby form a desired image on said mask,
    a second light source located on the interior of said transparent rotating drum, and
    a movable photosensitive printing plate sensitive to light in the range of 325 nm to 425 nm located adjacent to the exterior surface of said drum and arranged to move past the rotating drum surface at the same speed that the drum rotates, said second light source arranged to expose said printing plate through said mask with light in the range of 325 nm to 425 nm when said drum has rotated such that said formed image is between said second light source and said printing plate, thereby transferring said image to said plate, and
    a third light source directed onto the portion of said mask being exposed to light from said second light source, said third light source arranged to expose said mask to light in the range of 525 nm to 600 nm while said printing plate is simultaneously exposed through said mask with said second light source to inhibit state changes in said film.

9. The platemaking system of claim 8, wherein said first light source is a green or yellow laser, the output of said green or yellow laser deflected across said mask on said drum to form said desired image.

10. The platemaking system of claim 8, wherein said photosensitive printing plate is sensitive to ultraviolet/violet light and said second light source is an ultraviolet/violet light source.

11. The platemaking system of claim 8, wherein said bR film transforms from said substantially opaque state to said substantially transparent state when exposed to light at a second wavelength of about 412 nm±50 nm, said system further comprising a fourth light source arranged to expose said mask to light at said second wavelength after said image is transferred to said printing plate such that said formed image is erased.

12. The platemaking system of claim 11, wherein said system is arranged such that, for each revolution of said transparent rotating drum, said first light source forms said desired image on said mask, said second light source transfers said image to said moving photosensitive printing plate, and said fourth light source erases said formed image after is has been transferred.

13. The platemaking system of claim 8, further comprising at least one lens located between said second light source and said photosensitive printing plate to focus said image onto said photosensitive printing plate.

14. The platemaking system of claim 13, further comprising a lens located on the interior of said rotating drum between said second light source and said mask to focus said image onto said photosensitive printing plate.

15. The platemaking system of claim 13, further comprising a lens located between said mask and said photosensitive printing plate to focus said image onto said photosensitive printing plate.

16. The platemaking system of claim 15, wherein said lens is a graduated index (GRIN) lens.

17. The platemaking system of claim 8, further comprising a fiber optic array between said mask and said photosensitive printing plate to transfer said image from said mask onto said photosensitive printing plate.

18. The platemaking system of claim 8, wherein said photosensitive printing plate is a substantially flat plate.

19. The platemaking system of claim 8, wherein said photosensitive printing plate is at least partially curved around said drum to allow a larger area of said plate to be exposed at once.

20. A platemaking system using a bacteriorhodopsin (bR) film-based imaging mask, comprising:
   a movable transparent plate,
   a bR film applied to a surface of said movable transparent plate to form a mask on said plate, said bR film having a first state in which it is substantially transparent to light in the range of 325 nm to 425 nm, a second state in which it is substantially opaque to light in the range of 325 nm to 425 nm, said bR film inhibited from changing between said first and second states when simultaneously exposed to light in the range of 525 nm to 600 nm and to light in the range of 325 nm to 425 nm, said film at least temporarily transforming from said substantially transparent state to said substantially opaque state and temporarily remaining in said substantially opaque state when exposed to light at a first wavelength in the range of 525 nm to 600 nm, and transforming from said substantially opaque state to said substantially transparent state when exposed to light at a second wavelength of about 412 nm±50 nm,
   a first light source arranged to expose said mask to light at said first wavelength so as to render portions of said mask substantially opaque and thereby form a desired image on said mask,
   a photosensitive printing plate sensitive to light in the range of 325 nm to 425 nm,
   a second light source arranged to expose said movable photosensitive printing plate through said mask with light in the range of 325 nm to 425 nm such that the image on said mask is transferred to said photosensitive printing plate when said movable transparent plate is moved such that said formed image is between said second light source and said photosensitive printing plate,
   a third light source directed onto the portion of said mask being exposed to light from said second light source, said third light source arranged to expose said mask to light in the range of 525 nm to 600 nm while said printing plate is simultaneously exposed through said mask with said second light source to inhibit state changes in said film, and
   a fourth light source arranged to expose said mask to light at said second wavelength and thereby erase said image after said image is transferred to said printing plate, said system arranged such that said first light source forms said image on said mask as said movable transparent plate moves past said first light source and said second light source exposes said photosensitive printing plate when said movable transparent plate and said photosensitive printing plate are in respective fixed positions opposite each other.

21. The platemaking system of claim 20, wherein said photosensitive printing plate is movable, said printing plate after a formed image has been transferred onto a first section of said printing plate arranged to be moved to enable a section of said printing plate different from said first section to accept an image.

22. The platemaking system of claim 20, wherein said first light source is a scanning laser beam.

23. A method of forming an image on a photosensitive printing plate, comprising the steps of:
   forming a mask comprising a bacteriorhodopsin (bR) film which has a first state in which it is substantially transparent to light in the range of 325 nm to 425 nm, a second state in which it is substantially opaque to light in the range of 325 nm to 425 nm, and is inhibited from changing between said first and second states when simultaneously exposed to light in the range of 525 nm to 600 nm and to light in the range of 375 nm to 425 nm, said bR film at least temporarily transforming from said substantially transparent state to said substantially opaque state when exposed to light at a first wavelength in the range of 525 nm to 600 nm,
   forming a desired image on said mask by exposing said mask using light at said first wavelength to render portions of said mask opaque,
   exposing a photosensitive printing plate which is sensitive to light in the range of 325 nm to 425 nm with a first light to which said printing plate is sensitive through said mask to transfer said image onto said printing plate, and
   exposing the portion of said mask being exposed with said first light to light in the range of 525 nm to 600 nm while simultaneously exposing said plate through said mask to inhibit state changes in said film.

24. The method of claim 23, wherein said desired image is formed on said mask by deflecting a laser beam which operates at said first wavelength across said mask.

25. The method of claim 23, wherein said photosensitive printing plate is sensitive to ultraviolet/violet light and said image is transferred to said plate with ultraviolet/violet light.

26. The method of claim 23, wherein said film transforms from said substantially opaque state to said substantially transparent state when exposed to light at a second wavelength of about 412 nm±50 nm, further comprising the step of erasing said formed image from said mask after said image has been transferred to said plate by exposing said mask to light at said second wavelength.

\* \* \* \* \*